United States Patent
Du et al.

(10) Patent No.: US 10,969,419 B2
(45) Date of Patent: Apr. 6, 2021

(54) INSULATION DETECTION CIRCUIT, DETECTION METHOD AND BATTERY MANAGEMENT SYSTEM

(71) Applicant: Contemporary Amperex Technology Co., Limited, Ningde (CN)

(72) Inventors: Baohai Du, Ningde (CN); Guoxiu Wu, Ningde (CN); Weiqiang Li, Ningde (CN); Qiandeng Li, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 84 days.

(21) Appl. No.: 16/577,350

(22) Filed: Sep. 20, 2019

(65) Prior Publication Data

US 2020/0225275 A1 Jul. 16, 2020

(30) Foreign Application Priority Data

Jan. 15, 2019 (CN) .......................... 201910035203.7

(51) Int. Cl.
*H01H 31/12* (2006.01)
*G01R 31/12* (2020.01)
(Continued)

(52) U.S. Cl.
CPC ....... *G01R 31/1272* (2013.01); *G01R 31/006* (2013.01); *G01R 31/3835* (2019.01); *B60L 3/0046* (2013.01)

(58) Field of Classification Search
CPC ...... G01R 27/025; G01R 27/14; G01R 27/18; G01R 31/006; G01R 31/12;
(Continued)

(56) References Cited

U.S. PATENT DOCUMENTS

2013/0176041 A1* 7/2013 Yang ...................... G01R 27/14
324/691
2014/0021961 A1* 1/2014 Yamada ................. G01R 31/52
324/503
(Continued)

FOREIGN PATENT DOCUMENTS

CN 102362185 A 2/2012
CN 102612655 A 7/2012
(Continued)

OTHER PUBLICATIONS

The first Office Action and search report dated Aug. 21, 2019 for Chinese Application No. 201910035203.7, 9 pages.
(Continued)

*Primary Examiner* — Thang X Le
(74) *Attorney, Agent, or Firm* — Law Offices of Liaoteng Wang

(57) ABSTRACT

The present disclosure provides an insulation detection circuit, a detection method and a battery management system. The insulation detection circuit includes an isolated power module, first positive and negative sampling modules, second positive and negative sampling modules, and a processor. A first end of the second positive sampling module is connected to a positive electrode of the isolated power module and a second end of the positive switch module, a second end of the second positive sampling module is connected to a second reference voltage terminal; a first end of the second negative sampling module is connected to the second reference voltage terminal, a second end of the second negative sampling module is respectively connected to a negative electrode of the isolated power module and a second end of the negative switch module; and the processor is connected to sampling points.

14 Claims, 12 Drawing Sheets

(51) Int. Cl.
*G01R 31/3835* (2019.01)
*G01R 31/00* (2006.01)
*B60L 3/00* (2019.01)

(58) Field of Classification Search
CPC .. G01R 31/1272; G01R 31/14; G01R 31/385;
G01R 31/3835; G01R 31/389; G01R
31/3278; G01R 31/3662; G01R 31/3648;
G01R 31/50; G01R 31/52
See application file for complete search history.

(56) References Cited

U.S. PATENT DOCUMENTS

| | | | |
|---|---|---|---|
| 2016/0154064 A1 | 6/2016 | Klein et al. | |
| 2017/0297447 A1* | 10/2017 | Tzivanopoulos | .... G01R 31/382 |
| 2020/0144812 A1* | 5/2020 | Shin | ............ H01M 50/20 |

FOREIGN PATENT DOCUMENTS

| | | | |
|---|---|---|---|
| CN | 103033729 A | 4/2013 |
| CN | 103688183 A | 3/2014 |
| CN | 105158632 A | 12/2015 |
| CN | 105372549 A | 3/2016 |
| CN | 103048545 B | 4/2016 |
| CN | 105717404 A | 6/2016 |
| CN | 106199191 A | 12/2016 |
| CN | 104220887 B | 3/2017 |
| CN | 107526041 A | 12/2017 |
| CN | 107576914 A | 1/2018 |
| CN | 107728066 A | 2/2018 |
| CN | 207164146 U | 3/2018 |
| CN | 108099609 A | 6/2018 |
| CN | 207473060 U | 6/2018 |
| CN | 207502686 U | 6/2018 |
| CN | 108333492 A | 7/2018 |
| CN | 108680793 A | 10/2018 |
| CN | 108713150 A | 10/2018 |
| CN | 109765495 A | 5/2019 |
| KR | 101388466 B1 | 4/2014 |
| KR | 20150084532 A | 7/2015 |
| WO | 2015033627 A1 | 3/2015 |
| WO | WO2018139830 A1 | 8/2018 |

OTHER PUBLICATIONS

The second Office Action and search report dated Oct. 24, 2019 for Chinese Application No. 201910035203.7, 13 pages.
Jingxin Li, et al., "An Approach to Online Monitoring on Insulation Resistance in Electric Vehicle", Automobile Engineering, vol. 28. No. 10, dated Oct. 31, 2006, 4 pages.
Fang Kuang, et al., "Comparative Study on Methods of Calculating Insulation Resistance of Electric Vehicles", Chinese Journal of Automobile Engineering, vol. 8. No. 6, dated Nov. 30, 2018, 8 pages.
The extended European search report for European Application No. 19199481.3, dated Apr. 14, 2020, 7 pages.
PCT International Search Report for PCT/CN2020/072250, dated Apr. 20, 2020, 11 pages.

* cited by examiner

Acquire a first sampled signal from the first sampling point S11, acquire a second sampled signal from the second sampling point S12, and obtain, according to the first sampled signal and the second sampled signal, an insulation resistance value Rip of a positive high-voltage circuit on a side of the battery pack under detection relative to the first reference voltage terminal GND1 and an insulation resistance value Rin of a negative high-voltage circuit on the side of the battery pack under detection relative to the first reference voltage terminal GND1 ⟶ 801

Acquire a third sampled signal from the third sampling point S21, acquire a fourth sampled signal from the fourth sampling point S22, and obtain, according to the third sampled signal and the fourth sampled signal, an insulation resistance value Rep of a positive high-voltage circuit on a load side relative to the second reference voltage terminal GND2 and an insulation resistance value Ren of a negative high-voltage circuit on the load side relative to the second reference voltage terminal GND2 ⟶ 802

Fig. 8

INSULATION DETECTION CIRCUIT, DETECTION METHOD AND BATTERY MANAGEMENT SYSTEM

CROSS-REFERENCE TO RELATED APPLICATION

This application is based upon and claims priority to Chinese Patent Application No. 201910035203.7, filed on Jan. 15, 2019, the content of which is incorporated herein by reference in its entirety.

FIELD

The present disclosure relates to the field of battery technology, and more particularly to an insulation detection circuit, a detection method and a battery management system.

BACKGROUND

A battery pack is responsible for supplying electric energy to an electric motor of an electric vehicle. The battery pack is connected to a load through a positive switch module and a negative switch module respectively. It can be known from P=UI that it is necessary to use a high voltage or a large current to achieve a large power output. When using the high voltage, the high voltage may be easily introduced into a passenger compartment as insulation materials are aging or damaged, which is dangerous; when using the large current, line loss on a high voltage loop may be large and temperature in the loop may rise quickly, which brings a big challenge to heat dissipation of the vehicle system, and the temperature change may also influence performance of the insulation materials. Therefore, it is particularly important to detect and issue an early warning of insulation abnormality in advance.

At present, insulation detection is performed for the battery pack mostly based on an AC injection method or a voltage division method. However, the AC injection method or the voltage division method can only detect an insulation impedance on a side of the battery pack under detection before the positive switch module or the negative switch module is closed or detect an insulation impedance on a load side after the positive switch module or the negative switch module is closed, but cannot detect the insulation impedance on the load side when the positive switch module or the negative switch module is not closed. When the positive switch module or the negative switch module is closed, if there is a problem with the insulation impedance on the load side, it will cause damage to a controller. More seriously, if an insulation fault occurs between a main positive electrode on the load side or a main negative electrode on the load side and a reference ground or an external electric device is short-circuited, it may directly cause that a short circuit occurs in the battery pack and affect the safe operation of the electric vehicle.

SUMMARY

Embodiments of the present disclosure provide an insulation detection circuit, a detection method and a battery management system.

In a first aspect, the embodiments of the present disclosure provide an insulation detection circuit comprising an isolated power module, a first positive sampling module, a first negative sampling module, a second positive sampling module, a second negative sampling module, and a processor, wherein:

a first end of the first positive sampling module is respectively connected to a positive electrode of a battery pack under detection and a first end of a positive switch module, a second end of the first positive sampling module is connected to a first reference voltage terminal, and the first positive sampling module is configured to provide a first sampled signal to a first sampling point;

a first end of the first negative sampling module is connected to the first reference voltage terminal, a second end of the first negative sampling module is respectively connected to a negative electrode of the battery pack under detection and a first end of a negative switch module, and the first negative sampling module is configured to provide a second sampled signal to a second sampling point;

a first end of the second positive sampling module is respectively connected to a positive electrode of the isolated power module and a second end of the positive switch module, a second end of the second positive sampling module is connected to a second reference voltage terminal, and the second positive sampling module is configured to provide a third sampled signal to a third sampling point;

a first end of the second negative sampling module is connected to the second reference voltage terminal, a second end of the second negative sampling module is respectively connected to a negative electrode of the isolated power module and a second end of the negative switch module, and the second negative sampling module is configured to provide a fourth sampled signal to a fourth sampling point; and the processor is respectively connected to the first sampling point, the second sampling point, the third sampling point, and the fourth sampling point, and the processor is configured to obtain, according to the first sampled signal and the second sampled signal, an insulation resistance value of a positive high-voltage circuit on a side of the battery pack under detection relative to the first reference voltage terminal and an insulation resistance value of a negative high-voltage circuit on the side of the battery pack under detection relative to the first reference voltage terminal, and obtain, according to the third sampled signal and the fourth sampled signal, an insulation resistance value of a positive high-voltage circuit on a load side relative to the second reference voltage terminal and an insulation resistance value of a negative high-voltage circuit on the load side relative to the second reference voltage terminal.

In a second aspect, the embodiments of the present disclosure provide a battery management system comprising the above insulation detection circuit.

In a third aspect, the embodiments of the present disclosure provide a detection method for the above insulation detection circuit. The detection method comprises: acquiring a first sampled signal from the first sampling point, acquiring a second sampled signal from the second sampling point, and obtaining, according to the first sampled signal and the second sampled signal, an insulation resistance value of a positive high-voltage circuit on a side of the battery pack under detection relative to the first reference voltage terminal and an insulation resistance value of a negative high-voltage circuit on the side of the battery pack under detection relative to the first reference voltage terminal; and acquiring a third sampled signal from the third sampling point, acquiring a fourth sampled signal from the fourth sampling point, and obtaining, according to the third sampled signal and the fourth sampled signal, an insulation resistance value of a positive high-voltage circuit on a load side relative to the second reference voltage terminal and an insulation resistance value of a negative high-voltage circuit on the side of the load relative to the second reference voltage terminal.

In the embodiments of the present disclosure, a first end of the second positive sampling module is respectively connected to a positive electrode of the isolated power module and a second end of the positive switch module, a second end of the second positive sampling module is connected to a second reference voltage terminal; a first end of the second negative sampling module is connected to the second reference voltage terminal, a second end of the second negative sampling module is respectively connected to a negative electrode of the isolated power module and a second end of the negative switch module.

That is, the isolated power module together with the second positive sampling module, the second negative sampling module, the insulation resistance of the positive high-voltage circuit on the load side relative to the second reference voltage terminal and the insulation resistance of the negative high-voltage circuit on the load side relative to the second reference voltage terminal form a loop, and also the isolated power module together with an equivalent impedance of a load electric device form a loop. That is, the isolated power module can supply power to the second positive sampling module, the second negative sampling module, the insulation resistance of the positive high-voltage circuit on the load side relative to the second reference voltage terminal, the insulation resistance of the negative high-voltage circuit on the load side relative to the second reference voltage terminal and the load electric device.

BRIEF DESCRIPTION OF THE DRAWINGS

The present disclosure will be better understood from the following detailed description of the disclosure in conjunction with the accompanying drawings in which like or similar reference numerals refer to like or similar features.

FIG. 8 is a schematic flow chart of a detection method for an insulation detection circuit according to an eighth embodiment of the present disclosure;

DETAILED DESCRIPTION

Features of various aspects and exemplary embodiments of the present disclosure will be described in detail below. In the following detailed description, many specific details are disclosed to provide a thorough understanding of embodiments of the present disclosure.

The embodiments of the present disclosure provide an insulation detection circuit, a detection method and a battery management system. The insulation detection circuit can detect the insulation impedance on the load side when the positive switch module or the negative switch module is closed. The positive switch module or the negative switch module is located between the battery pack and a load circuit, and other electrically controlled switches can also be used. The battery management system may include the above insulation detection circuit. As an example, the insulation detection circuit described above can be integrated in the battery management system.

It is to be noted that the battery pack under detection in the embodiments of the present disclosure may be a lithium ion battery, a lithium metal battery, a lead acid battery, a nickel battery, a nickel hydrogen battery, a lithium sulfur battery, a lithium air battery or a sodium ion battery, which is not limited herein. In terms of scale, the battery pack under detection may also be a cell or a battery module or a battery package, which is not limited herein.

Figure 1:
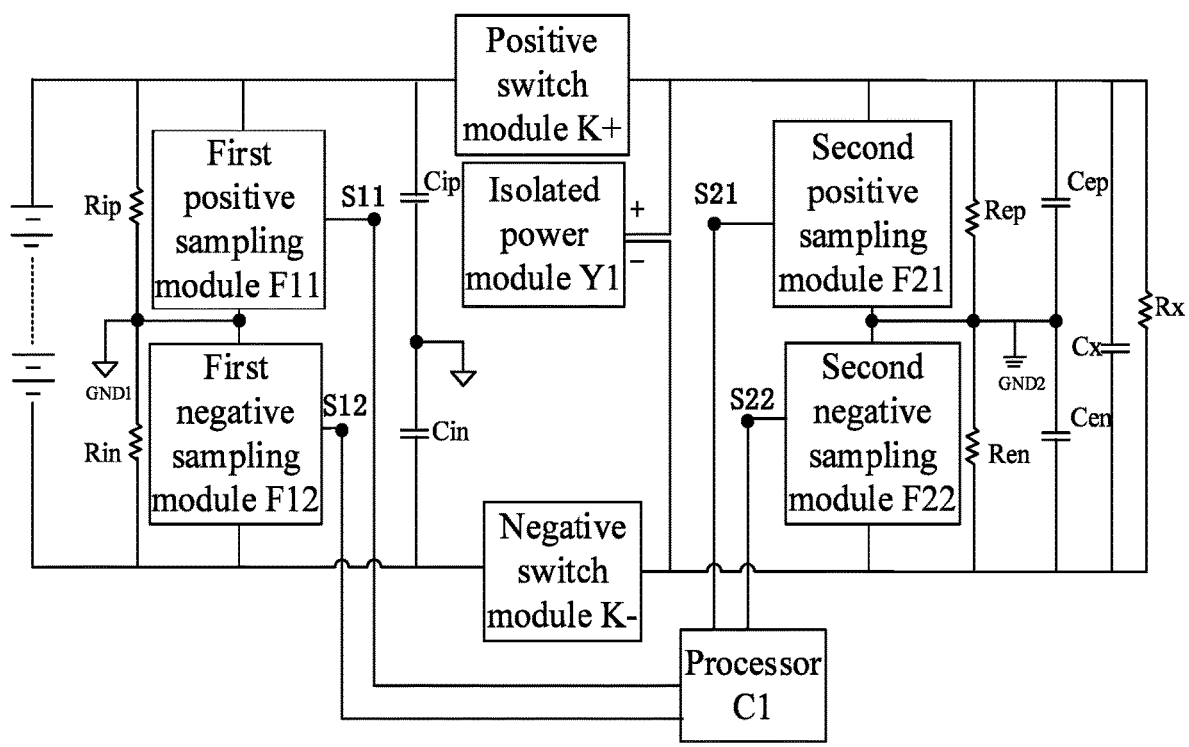
FIG. 1 is a schematic structural diagram of an insulation detection circuit according to a first embodiment of the present disclosure.

FIG. 1 is a schematic structural diagram of an insulation detection circuit according to a first embodiment of the present disclosure. As shown in FIG. 1, the insulation detection circuit includes an isolated power module Y1, a first positive sampling module F11, a first negative sampling module F12, a second positive sampling module F21, a second negative sampling module F22, and a processor C1.

A first end of the first positive sampling module F11 is respectively connected to a positive electrode of a battery pack under detection and a first end of a positive switch module K+, a second end of the first positive sampling module F11 is connected to a first reference voltage terminal GND1, and the first positive sampling module F11 is configured to provide a first sampled signal to a first sampling point S11.

A first end of the first negative sampling module F12 is connected to the first reference voltage terminal GND1, a second end of the first negative sampling module F12 is respectively connected to a negative electrode of the battery pack under detection and a first end of a negative switch module K−, and the first negative sampling module F12 is configured to provide a second sampled signal to a second sampling point S12.

A first end of the second positive sampling module F21 is respectively connected to a positive electrode of the isolated power module Y1 and a second end of the positive switch module K+, a second end of the second positive sampling module F21 is connected to a second reference voltage terminal GND2, and the second positive sampling module F21 is configured to provide a third sampled signal to a third sampling point S21.

A first end of the second negative sampling module F22 is connected to the second reference voltage terminal GND2, a second end of the second negative sampling module F22 is respectively connected to a negative electrode of the isolated power module Y1 and a second end of the negative switch module K−, and the second negative sampling module F22 is configured to provide a fourth sampled signal to a fourth sampling point S22.

The processor C1 is respectively connected to the first sampling point S11, the second sampling point S12, the third sampling point S21, and the fourth sampling point S22, and the processor C1 is configured to obtain, according to the first sampled signal and the second sampled signal, an insulation resistance value Rip of a positive high-voltage circuit on a side of the battery pack under detection relative to the first reference voltage terminal GND1 and an insulation resistance value Rin of a negative high-voltage circuit on the side of the battery pack under detection relative to the first reference voltage terminal GND1, and obtain, according to the third sampled signal and the fourth sampled signal, an insulation resistance value Rep of a positive high-voltage circuit on a load side relative to the second reference voltage terminal GND2 and an insulation resistance value Ren of a negative high-voltage circuit on the load side relative to the second reference voltage terminal GND2.

The positive switch module K+ and the negative switch module K− can be understood as switches between the battery pack under detection and the load circuit, such as a relay, an insulated gate bipolar transistor (IGBT), or the like.

Actual voltages of the first reference voltage terminal GND1 and the second reference voltage terminal GND2 may be set according to working scenarios and requirements of the insulation detection circuit, and the two voltages may be the same or different, which is not limited herein. In an example, the first reference voltage terminal GND1 may be connected to a housing of the battery pack, and the second reference voltage terminal GND2 may be connected to the vehicle body.

The processor C1 may be a processor C1 dedicated to the insulation detection circuit, or may be a processor C1 shared with other circuits. The detection circuit may be an independent circuit structure or a part of an overall circuit structure. The control of the positive switch module K+ and the negative switch module K− may be performed by the processor C1 or other control device, which is not limited herein.

Illustratively, the insulation detection circuit in the embodiments of the present disclosure can be integrated in the battery management system of the battery pack, and a part of the overall circuit structure of the battery management system is used for insulation detection of the battery pack.

FIG. 1 also shows Cip, Cin, Cep, Cen, and Cx, where Cip and Cin are respectively an equivalent capacitance between the positive electrode and the housing of the battery pack under detection and an equivalent capacitance between the negative electrode and the housing of the battery pack under detection; Cep and Cen are respectively an equivalent capacitance between the positive electrode of the battery pack under detection and the vehicle body and an equivalent capacitance between the negative electrode of the battery pack under detection and the vehicle body, and Cx is an X capacitor.

In the embodiments of the present disclosure, a first end of the second positive sampling module F21 is respectively connected to a positive electrode of the isolated power module Y1 and a second end of the positive switch module K+, a second end of the second positive sampling module F21 is connected to a second reference voltage terminal GND2; a first end of the second negative sampling module F22 is connected to the second reference voltage terminal GND2, a second end of the second negative sampling module F22 is respectively connected to a negative electrode of the isolated power module Y1 and a second end of the negative switch module K−.

That is, the isolated power module Y1 together with the second positive sampling module F21, the second negative sampling module F22, the insulation resistance Rep and the insulation resistance Ren may form a loop, and the isolated power module Y1 together with an equivalent impedance Rx of a load electric device may also form a loop. That is, the isolated power module Y1 can supply power to the second positive sampling module F21, the second negative sampling module F22, the insulation resistance Rep, the insulation resistance Ren and the load electric device.

Compared to the prior art in which the battery pack under detection supplies power to the second positive sampling module F21, the second negative sampling module F22, the insulation resistance Rep, the insulation resistance Ren and the load electric device only when the positive switch module K+ and the negative switch module K− are both closed (also referred to as "in ON state"), the insulation detection circuit according to the present disclosure can detect the insulation impedance on the load side of the battery pack under detection even when both the positive switch module K+ and the negative switch module K− are not closed (also referred to as "in OFF state"), since the isolated power module Y1 can replace the battery pack under detection to supply power to the second positive sampling module F21, the second negative sampling module F22, the insulation resistance Rep, the insulation resistance Ren and the load electric device.

In addition, compared to the prior art in which only an insulation resistance value of the insulation resistance Rep in parallel with the insulation resistance Ren of the system when the positive switch module K+ or the negative switch module K− is in ON state can be measured, according to the embodiments of the present disclosure, the insulation resistance Rep can be distinguished from the insulation resistance Ren on the load side, and thus it may be possible to identify whether there is a problem with the positive electrode or the negative electrode where the load is located.

It should be noted that a switch (not shown) can be added at a positive output terminal and a negative output terminal of the isolated power module Y1, so as to switch off when the battery pack does not need to perform the insulation impedance detection on the load side and thus avoid high voltages in the battery pack being introduced into the isolated power module Y1.

Figure 2:
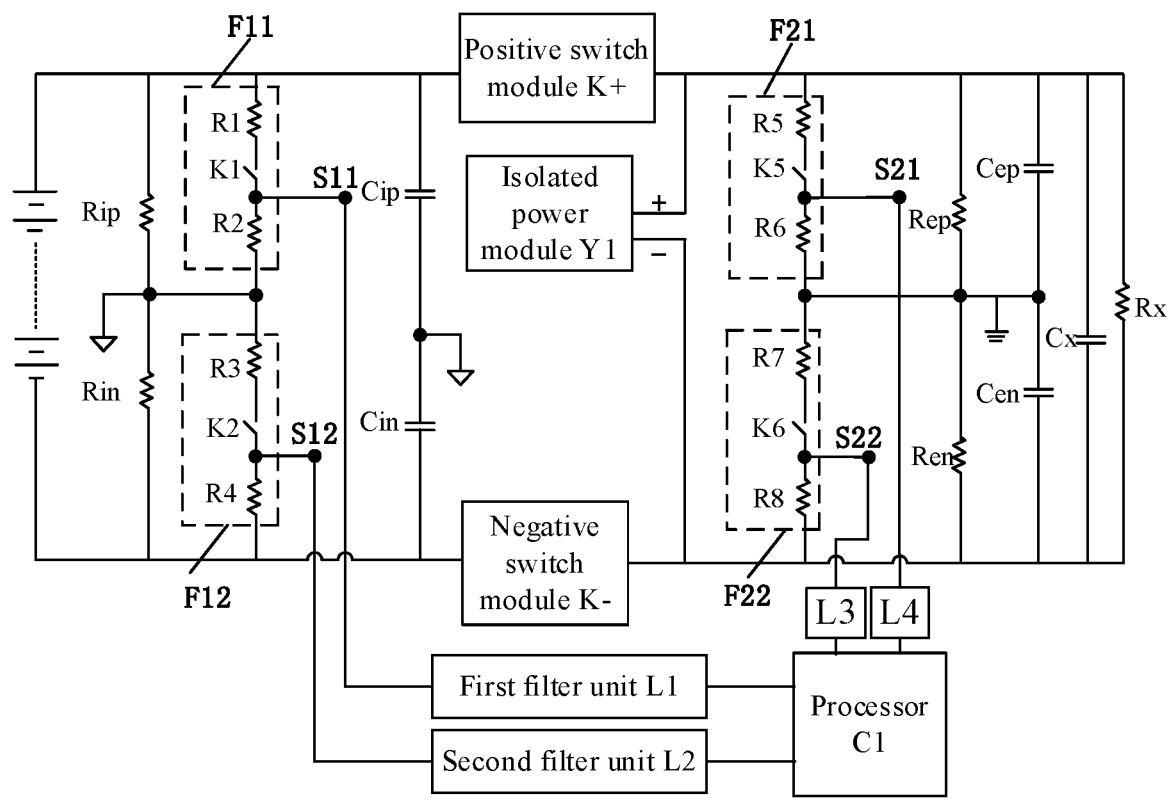
FIG. 2 is a schematic structural diagram of an insulation detection circuit according to a second embodiment of the present disclosure.

FIG. 2 is a schematic structural diagram of an insulation detection circuit according to a second embodiment of the present disclosure. As shown in FIG. 2, a first positive sampling module F11, a first negative sampling module F12, a second positive sampling module F21, and a second negative sampling module F22 may include components. Specific structures of the first positive sampling module F11, the first negative sampling module F12, the second positive sampling module F21, and the second negative sampling module F22 will be exemplified below.

In an example, the first positive sampling module F11 includes a first resistor network R1, a second resistor network R2, and a first switch K1 connected in series; and the first negative sampling module F12 includes a third resistor network R3, a fourth resistor network R4, and a second switch K2 connected in series.

A first end of the first resistor network R1 is respectively connected to the positive electrode of the battery pack under detection and the first end of the positive switch module K1, and a second end of the first resistor network R1 is respectively connected to a first end of the second resistor network R2 and the first sampling point S11, and a second end of the second resistor network R2 is connected to the first reference voltage terminal GND1.

A first end of the third resistor network R3 is connected to the first reference voltage terminal GND1, a second end of the third resistor network R3 is respectively connected to the second sampling point S12 and a first end of the fourth resistor network R4, and a second end of the fourth resistor network R4 is respectively connected to the negative electrode of the battery pack under detection and the first end of the negative switch module K−.

Here, the first resistor network R1, the second resistor network R2, the third resistor network R3, and the fourth resistor network R4 function as a voltage divider. The variation range of the first sampled signal at the first sampling point S11 can be adjusted by changing the resistance values of the first resistor network R1 and the second resistor network R2; and the variation range of the second sampled signal at the second sampling point S12 can be adjusted by changing the resistance values of the third resistor network R3 and the fourth resistor network R4. Illustratively, for ease of calculation, the combination forms and the resistance values of the first resistor network R1 and the second resistor network R2 may be the same, and the combination forms and the resistance values of the third resistor network R3 and the fourth resistor network R4 may be the same.

Positions of the first switch K1 and the second switch K2 are adjustable, and the first switch K1 and the second switch K2 are configured to cooperate to provide the first sampled signal and the second sampled signal. For example, when the first switch K1 is in ON state and the second switch K2 is in OFF state, the first sampled signal can be provided at the first sampling point S11; and when the first switch K1 is in OFF state and the second switch K2 is in ON state, the second sampled signal can be provided at the second sampling point S12.

Two ends of the first switch K1 shown in FIG. 2 are respectively connected to the second end of the first resistor network R1 and the first sampling point S11. For example, the two ends of the first switch K1 may also be respectively connected to the positive electrode of the battery pack under detection and the first end of the first resistor network R1, or may also be respectively connected to the first sampling point S11 and the first end of the second resistor network R2, or may also be respectively connected to the second end of the second resistor network R3 and the first reference voltage terminal GND1.

Two ends of the second switch K2 shown in FIG. 2 are respectively connected to the second end of the third resistor network R3 and the second sampling point S12. For example, the two ends of the second switch K2 may also be respectively connected to the first reference voltage terminal GND1 and the first end of the third resistor network R3, or may also be respectively connected to the second sampling point S12 and the first end of the fourth resistor network R4, or may also be respectively connected to the second end of the fourth resistor network R4 and the negative electrode of the battery pack under detection.

In an example, the second positive sampling module F21 includes a fifth resistor network R5, a sixth resistor network R6, and a fifth switch K5 connected in series; and the second negative sampling module F22 includes a seventh resistor network R7, an eighth resistor network R8, and a sixth switch K6.

A first end of the fifth resistor network R5 is connected to the positive electrode of the isolated power module Y1 and the second end of the positive switch module K+, a second end of the fifth resistor network R5 is respectively connected to the third sampling point S21 and a first end of the sixth resistor network R6, and a second end of the sixth resistor network R6 is connected to the second reference voltage terminal GND2.

A first end of the seventh resistor network R7 is connected to the second reference voltage terminal GND2, a second end of the seventh resistor network R7 is respectively connected to the fourth sampling point S22 and a first end of the eighth resistor network R8, and a second end of the eighth resistor network R8 is respectively connected to the negative electrode of the isolated power module Y1 and the second end of the negative switch module K−.

Here, the fifth resistor network R5, the sixth resistor network R6, the seventh resistor network R7, and the eighth resistor network R8 function as a voltage divider. The variation range of the third sampled signal at the third sampling point S21 can be adjusted by changing the resistance values of the fifth resistor network R5 and the sixth resistor network R6; and the variation range of the fourth sampled signal at the fourth sampling point S22 can be adjusted by changing the resistance values of the seventh resistor network R7 and the eighth resistor network R8. Illustratively, for ease of calculation, the combination forms and the resistance values of the fifth resistor network R5 and the sixth resistor network R6 may be the same, and the combination forms and the resistance values of the seventh resistor network R7 and the eighth resistor network R8 may be the same.

Positions of the fifth switch K5 and the sixth switch K6 are adjustable, and the fifth switch K5 and the sixth switch K6 are configured to cooperate to provide the third sampled signal and the fourth sampled signal. For example, when the fifth switch K5 is in ON state and the sixth switch K6 is in OFF state, the third sampled signal can be provided at the third sampling point S21; and when the fifth switch K5 is in OFF state and the sixth switch K6 is in ON state, the fourth sampled signal can be provided at the fourth sampling point S22.

Two ends of the fifth switch K5 shown in FIG. 2 are respectively connected to the second end of the fifth resistor network R5 and the third sampling point S21. For example, the two ends of the fifth switch K5 may also be respectively connected to the positive electrode of the isolated power module Y1 and the first end of the fifth resistor network R5, or may also be respectively connected to the third sampling point S21 and the first end of the sixth resistor network R6, or may also be respectively connected to the second end of the sixth resistor network R6 and the second reference voltage terminal GND2.

It should be noted that according to specific working scenarios and work requirements, it may be determined whether the first switch K1, the second switch K2, the third switch K3, or the fourth switch K4 should be provided, and also the order of turning on/off these individual switches may be determined. The switches may include a component that can implement a switching function, which is not limited herein. For example, the switch may be a mechanical switch such as a single-pole single-throw switch, or an electronic switch such as a triode, a metal-oxide-semiconductor field effect crystal (MOS) tube, or a reed switch.

In an example, the insulation detection circuit further includes a first analog-to-digital conversion unit, a second analog-to-digital conversion unit, a third analog-to-digital conversion unit, and a fourth analog-to-digital conversion unit (not shown). The first analog-to-digital conversion unit, the second analog-to-digital conversion unit, the third analog-to-digital conversion unit, and the fourth analog-to-digital conversion unit may be separate ADC conversion chips or may be implemented by a processor.

Two ends of the first analog-to-digital conversion unit are respectively connected to the first sampling point S11 and the processor C1, and the first analog-to-digital conversion unit is configured to convert an analog signal collected from the first sampling point S11 into a digital signal; two ends of the second analog-to-digital conversion unit are respectively connected to the second sampling point S12 and the processor C1, and the second analog-to-digital conversion unit is configured to convert an analog signal collected from the second sampling point S12 into a digital signal; two ends of the third analog-to-digital conversion unit are respectively connected to the third sampling point S21 and the processor C1, and the third analog-to-digital conversion unit is configured to convert an analog signal collected from the third sampling point S21 into a digital signal; two ends of the fourth analog-to-digital conversion unit are respectively connected to the fourth sampling point S22 and the processor C1, and the fourth analog-to-digital conversion unit is configured to convert an analog signal collected from the fourth sampling point S22 into a digital signal.

FIG. 2 also shows a first filter unit L1, a second filter unit L2, a third filter unit L3 and a fourth filter unit L4. A first end of the first filter unit L1 is connected to the first sampling point S11, a second end of the first filter unit L1 is connected to the processor, and the first filter unit L1 is configured to perform filter processing on the first sampled signal; a first end of the second filter unit L2 is connected to the second sampling point S12, and a second end of the second filter unit L2 is connected to the processor, and the second filter unit L2 is configured to perform filter processing on the second sampled signal; a first end of the third filter unit L3 is connected to the third sampling point S21, and a second end of the third filter unit L3 is connected to the processor, and the third filter unit L3 is configured to perform filter processing on the third sampled signal; a first end of the fourth filter unit L4 is connected to the fourth sampling point S22, and a second end of the fourth filter unit L4 is connected to the processor, and the fourth filter unit L4 is configured to perform filter processing on the fourth sampled signal. The filter units can filter out an interference part from the sampled signals and improve sampling precisions of the signals. Specific implementation forms of the filter units are not limited herein.

Figure 3:
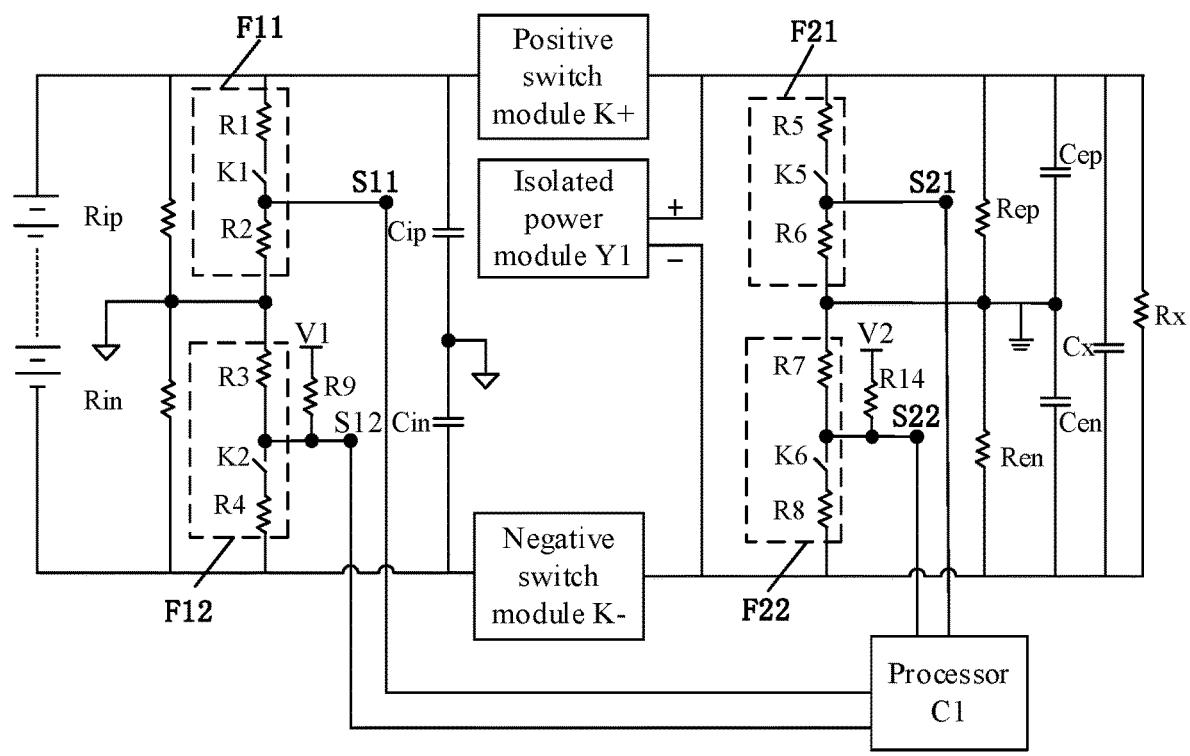
FIG. 3 is a schematic structural diagram of an insulation detection circuit according to a third embodiment of the present disclosure.

FIG. 3 is a schematic structural diagram of an insulation detection circuit according to a third embodiment of the present disclosure. FIG. 3 is different from FIG. 2 in that the insulation detection circuit shown in FIG. 3 further includes a first pull-up voltage source V1 and a ninth resistor network R9, and a second pull-up voltage source V2 and a fourteenth resistor network R14.

A first end of the ninth resistor network R9 is connected to the first pull-up voltage source V1, and a second end of the ninth resistor network R9 is connected to the second sampling point S12. That is, in the embodiments of the present disclosure, a pull-up power supply is added at a detection port of the analog-to-digital conversion unit between a main negative electrode (the negative electrode of the battery pack under detection) and the first reference voltage terminal GND1. In this way, a detection port of a same analog-to-digital conversion unit can be used for both the main positive electrode and the main negative electrode relative to the first reference voltage terminal GND1, thereby avoiding the necessity of using two analog-to-digital conversion units with different reference voltages to perform detection due to opposite directions of the voltages of the main positive electrode and the main negative electrode relative to the first reference voltage terminal GND1, and thus saving detection resources.

A first end of the fourteenth resistor network R14 is connected to the second pull-up voltage source V2, and a second end of the fourteenth resistor network R14 is connected to the fourth sampling point S22. That is, in the embodiments of the present disclosure, a pull-up power supply is added at a detection port of the analog-to-digital conversion unit between the negative electrode of the isolated power module Y1 and the first reference voltage terminal GND1. In this way, a detection port of a same analog-to-digital conversion unit can be used for both the positive electrode and the negative electrode of the isolated power module Y1 relative to the second reference voltage terminal GND2, thereby avoiding the necessity of using two analog-to-digital conversion units with different reference voltages to perform detection due to opposite directions of the voltages of the positive electrode and the negative electrode relative to the second reference voltage terminal GND2, and thus saving detection resources.

It should be noted that, as shown in FIG. 3, in order to prevent the second sampled signal from being affected by the impedance of the second switch K2, it is preferable that the two ends of the second switch K2 are respectively connected to the second sampling point S12 and the first end of the fourth resistor network R4. Likewise, in order to prevent the fourth sampled signal from being affected by the impedance of the sixth switch K6, it is preferable that the two ends of the sixth switch K6 are respectively connected to the fourth sampling point S22 and the first end of the eighth resistor network R8.

Figure 4:
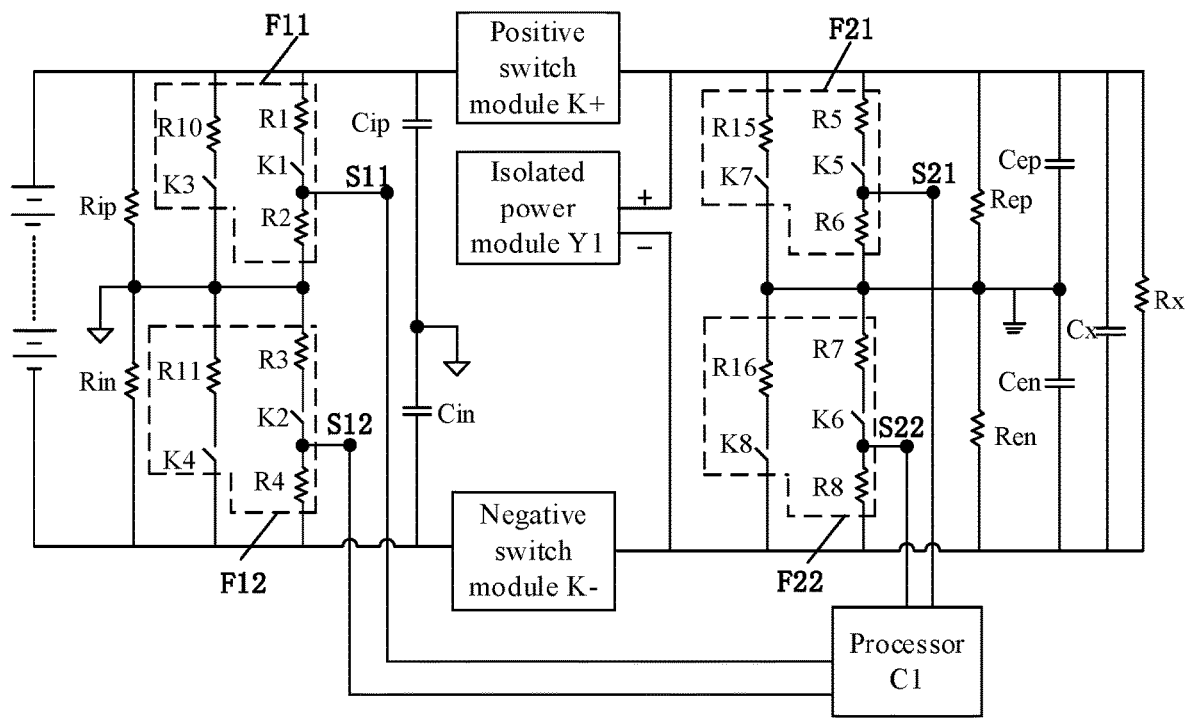
FIG. 4 is a schematic structural diagram of an insulation detection circuit according to a fourth embodiment of the present disclosure.

FIG. 4 is a schematic structural diagram of an insulation detection circuit according to a fourth embodiment of the present disclosure. FIG. 4 is different from FIG. 2 in that the insulation detection circuit shown in FIG. 4 further includes a tenth resistor network R10 and a third switch K3 connected in series, an eleventh resistor network R11 and a fourth switch K4 connected in series, a fifteenth resistor network R15 and a seventh switch K7 connected in series, and a sixteenth resistor network R16 and an eighth switch K8 connected in series.

A first end of the tenth resistor network R10 is connected to the positive electrode of the battery pack under detection, and a second end of the tenth resistor network R10 is connected to the first reference voltage terminal GND1; a first end of the eleventh resistor network R11 is connected to the first reference voltage terminal GND1, and a second end of the eleventh resistor network R11 is connected to the negative electrode of the battery pack under detection.

Since the first resistor network R1, the second resistor network R2, the third resistor network R3, or the fourth resistor network R4 may include a resistor with a large resistance value, the impedance of the insulation detection circuit may affect the detection accuracy of the insulation impedance on the side of the battery pack under detection. With the tenth resistor network R10 and the eleventh resistor network R11 in parallel with the first resistor network R1, the second resistor network R2, the third resistor network R3, and the fourth resistor network R4, the impedance of the insulation detection circuit may be reduced by controlling the connection of the tenth resistor network R10 and/or the eleventh resistor network R11, so as to reduce the influence on the detection accuracy of the insulation impedance on the side of the battery pack under detection and thus improve the insulation detection accuracy.

Further, by reducing the resistance value of the tenth resistor network R10 and/or the eleventh resistor network R11, the influence of the impedance of the insulation detection circuit on the detection accuracy of the insulation impedance on the side of the battery pack under detection may be minimized, and the insulation detection accuracy may be improved.

A first end of the fifteenth resistor network R15 is connected to the positive electrode of the isolated power module Y1, and a second end of the fifteenth resistor network R15 is connected to the second reference voltage terminal GND2; a first end of the sixteenth resistor network R16 is connected to the second reference voltage terminal GND2, and a second end of the sixteenth resistor network R16 is connected to the negative electrode of the isolated power module Y1.

Likewise, since the fifth resistor network R5, the sixth resistor network R6, the seventh resistor network R7, or the eighth resistor network R8 may include a resistor with a large resistance value, the impedance of the insulation detection circuit may affect the detection accuracy of the insulation impedance on the load side. With the fifteenth resistor network R15 and the sixteenth resistor network R16 in parallel with the fifth resistor network R5, the sixth resistor network R6, the seventh resistor network R7, and the eighth resistor network R8, the impedance of the insulation detection circuit may be reduced by controlling the connection of the fifteenth resistor network R15 and/or the sixteenth resistor network R16, so as to reduce the influence on the detection accuracy of the insulation impedance on the load side and thus improve the insulation detection accuracy.

Further, by reducing the resistance value of the fifteenth resistor network R15 and/or the sixteenth resistor network R16, the influence of the impedance of the insulation detection circuit on the detection accuracy of the insulation impedance on the load side may be minimized, and the insulation detection accuracy may be improved.

The positions of the third switch K3, the fourth switch K4, the seventh switch K7, and the eighth switch K8 are adjustable. The two ends of the third switch K3 shown in FIG. 4 are respectively connected to the second end of the tenth resistor network R10 and the first reference voltage terminal GND1, the two ends of the fourth switch K4 are respectively connected to the second end of the eleventh resistor network R11 and the negative electrode of the battery pack under detection, the two ends of the seventh switch K7 are respectively connected to the second end of the fifteenth resistor network R15 and the second reference voltage terminal GND2, and the two ends of the eighth switch K8 are respectively connected to the second end of the sixteenth resistor network R16 and the negative electrode of the isolated power module Y1.

For example, the two ends of the third switch K3 may also be respectively connected to the positive electrode of the battery pack under detection and the first end of the tenth resistor network R10, the two ends of the fourth switch K4 may also be respectively connected to the first reference voltage terminal GND1 and the first end of the eleventh resistor network R11, the two ends of the seventh switch K7 may also be respectively connected to the positive electrode of the isolated power module Y1 and the first end of the fifteenth resistor network R15, and the two ends of the eighth switch K8 may also be respectively connected to the second reference voltage terminal GND2 and the first end of the sixteenth resistor network R16.

Figure 5:
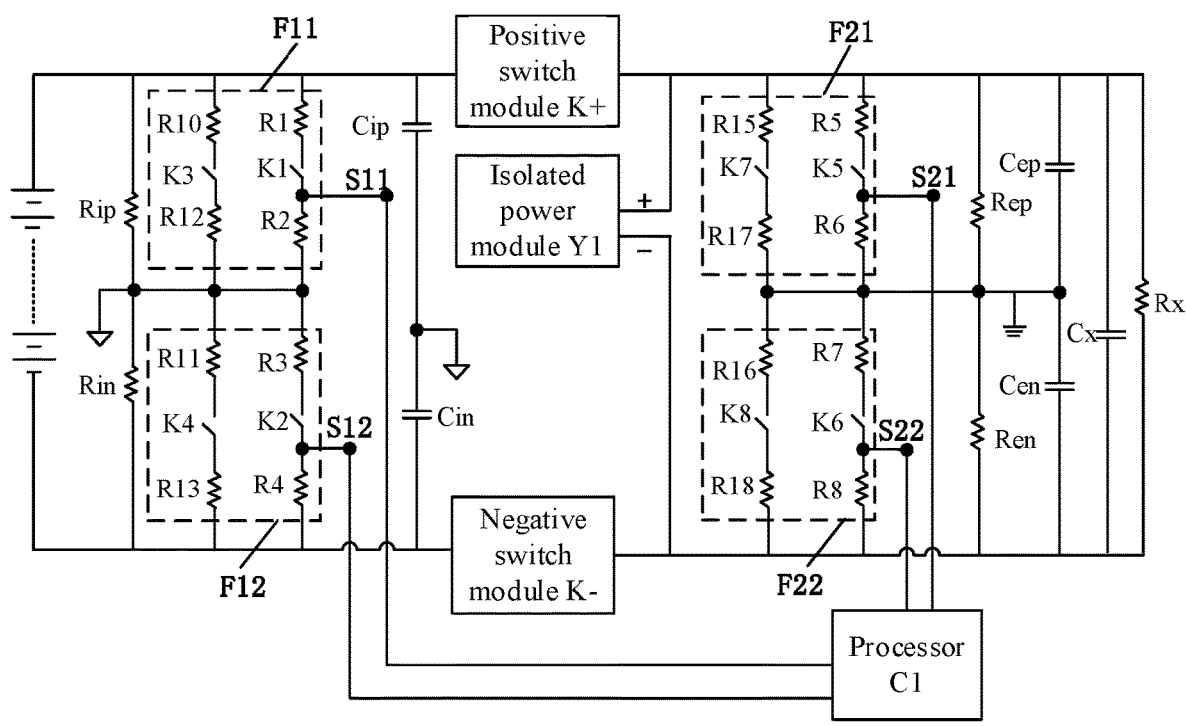
FIG. 5 is a schematic structural diagram of an insulation detection circuit according to a fifth embodiment of the present disclosure.

FIG. 5 is a schematic structural diagram of an insulation detection circuit according to a fifth embodiment of the present disclosure. FIG. 5 is different from FIG. 4 in that the insulation detection circuit shown in FIG. 5 further includes a twelfth resistor network R12, a thirteenth resistor network R13, a seventeenth resistor network R17, and an eighteenth resistor network R18.

The twelfth resistor network R12 is connected in series with the tenth resistor network R10 and the third switch K3. The first end of the twelfth resistor network R12 is connected to the second end of the tenth resistor network R10, and the second end of the twelfth resistor network R12 is connected to the first reference voltage terminal GND1. By using the third switch K3 to control the connection of the tenth resistor network R10 and the twelfth resistor network R12, the influence on the detection accuracy of the insulation impedance on the side of the battery pack under detection can be reduced and thus the insulation detection accuracy can be improved.

The thirteenth resistor network R13 is connected in series with the eleventh resistor network R11 and the fourth switch K4. The first end of the thirteenth resistor network R13 is connected to the second end of the eleventh resistor network R11, and the second end of the thirteenth resistor network R13 is connected to the negative electrode of the battery pack under detection. By using the fourth switch K4 to control the connection of the eleventh resistor network R11 and the thirteenth resistor network R13, the influence on the detection accuracy of the insulation impedance on the side of the battery pack under detection can be reduced and thus the insulation detection accuracy can be improved.

The seventeenth resistor network R17 is connected in series with the fifteenth resistor network R15 and the seventh switch K7. The first end of the seventeenth resistor network R17 is connected to the second end of the fifteenth resistor network R15, and the second end of the seventeenth resistor network R17 is connected to the second reference voltage terminal GND2. By using the fifth switch K7 to control the connection of the fifteenth resistor network R15 and the seventeenth resistor network R17, the influence on the detection accuracy of the insulation impedance on the load side can be reduced and the insulation detection accuracy can be improved.

The eighteenth resistor network R18 is connected in series with the sixteenth resistor network R16 and the eighth switch K8. The first end of the eighteenth resistor network R18 is connected to the second end of the sixteenth resistor network R16, and the second end of the eighteenth resistor network R18 is connected to the negative electrode of the isolated power module Y1. By using the eighth switch K8 to control the sixteenth resistor network R16 and the eighteenth resistor network R18, the influence on the detection accuracy of the insulation impedance on the load side can be reduced and the insulation detection accuracy can be improved.

The positions of the third switch K3, the fourth switch K4, the seventh switch K7 and the eighth switch K8 in corresponding detection branches in FIG. 5 may be adjustable by those skilled in the art according to the above described functions of these switches, which is not limited herein.

Figure 6:
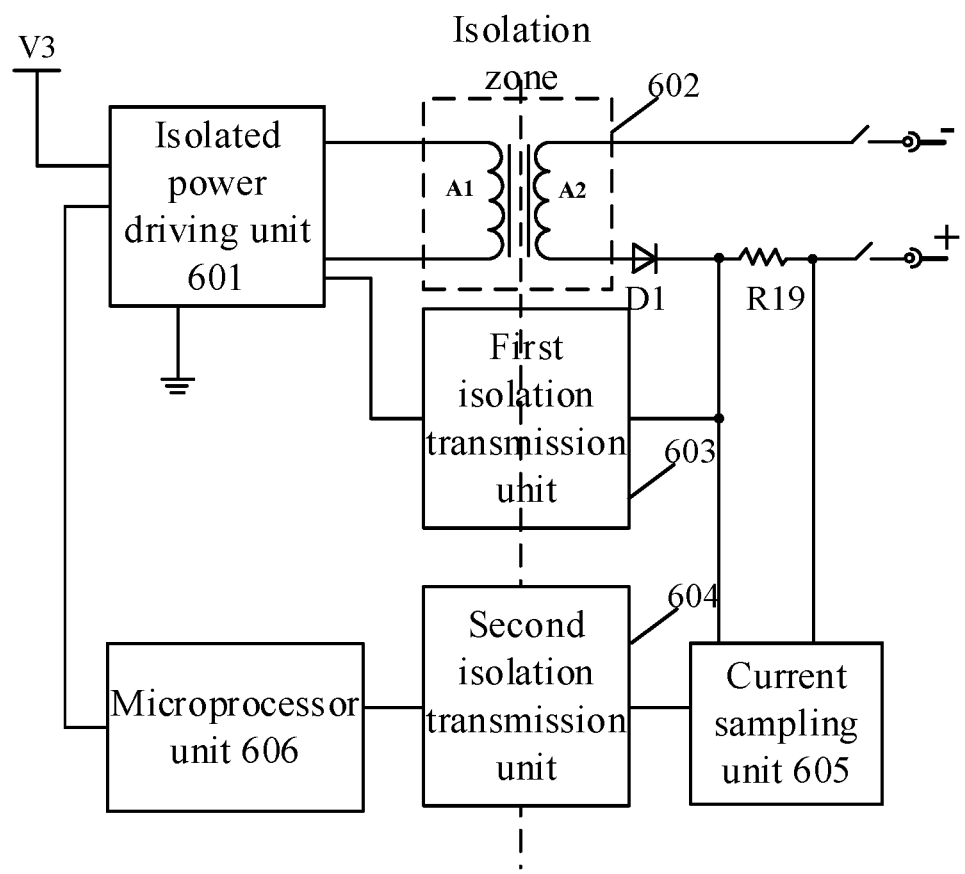
FIG. 6 is a schematic structural diagram of a flyback isolated power module according to a sixth embodiment of the present disclosure.

FIG. 6 is a schematic structural diagram of a flyback isolated power module according to a sixth embodiment of the present disclosure.

Figure 7:
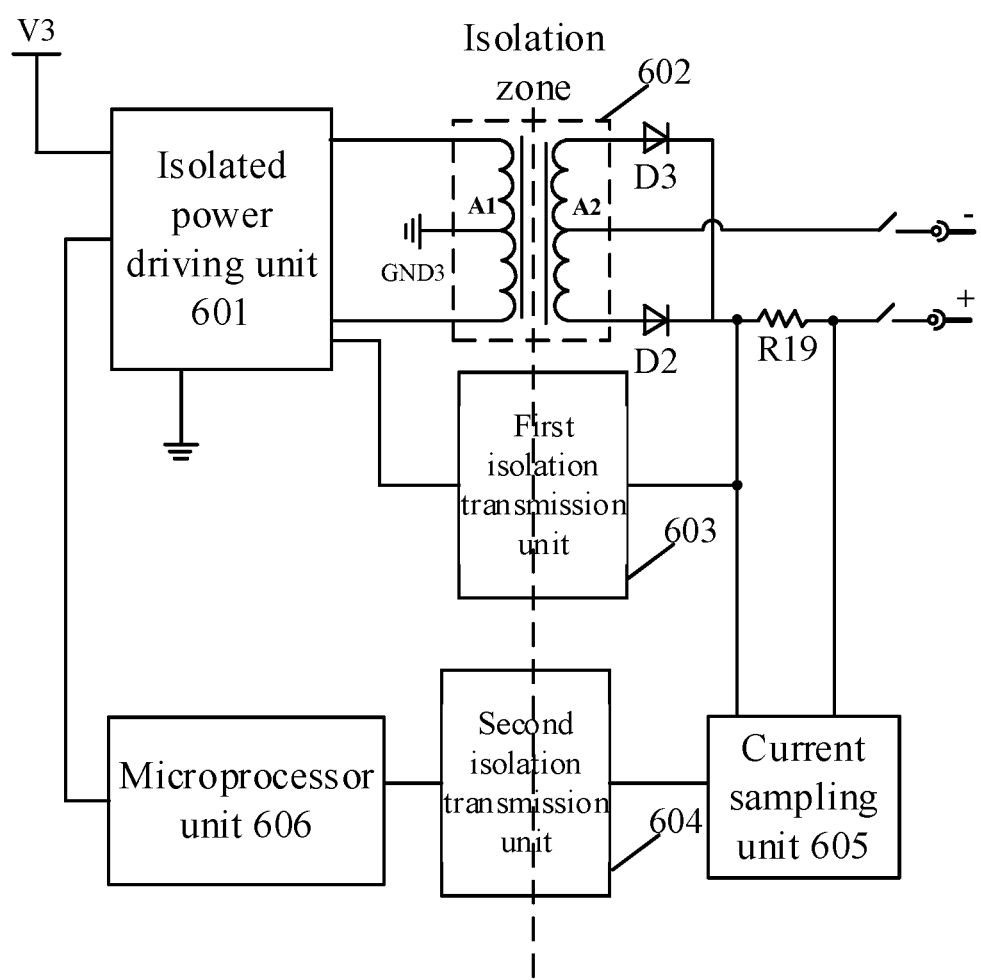
FIG. 7 is a schematic structural diagram of a push-pull isolated power module according to a seventh embodiment of the present disclosure.

FIG. 7 is a schematic structural diagram of a push-pull isolated power module according to a seventh embodiment of the present disclosure.

In an example, the isolated power module Y1 includes an isolated power driving unit 601 and a transformer 602 connected to each other. The isolated power driving unit 601 can be powered by a DC voltage source (such as 12V) or a battery pack; an output voltage of the DC voltage source or the battery pack are processed by the isolated power driving unit 601 and the transformer 602 and then supplied to the positive and negative electrodes of the isolated power module Y1. For example, the output voltage is boosted from 12V to 60V. It is noted that the voltage after being boosted by the transformer 602 should not be too high, so as to avoid the high voltage affecting the safety of the load circuit.

In the example of FIG. 6, a coil of a transformer of the flyback isolated power module includes two ends, which are respectively a first end and a second end. A first end of a coil A1 on a first side of the transformer is connected to a first output terminal of the isolated power driving unit 601, and a second end of the coil A1 on the first side of the transformer is connected to a second output terminal of the isolated power driving unit 601; a first end of a coil A2 on a second side of the transformer supplies power to the positive electrode of the isolated power module Y1, and a second end of the coil A2 on the second side of the transformer supplies power to the negative electrode of the isolated power module Y1.

In the example of FIG. 7, a coil of a transformer of the push-pull isolated power module includes three ends, which are respectively a first end, a second end, and a third end. A first end of a coil A1 on a first side of the transformer is connected to the first output terminal of the isolated power driving unit 601, a second end of the coil A1 on the first side of the transformer is connected to a third reference voltage terminal GND3, and a third end of the coil A1 on the first side of the transformer is connected to the second output terminal of the isolated power driving unit 601; a first end of a coil A2 on a second side of the transformer supplies power to the positive electrode of the isolated power module Y1, a second end of the coil A2 on the second side of the transformer supplies power to the negative electrode of the isolated power module Y1, and a third end of the coil A2 on the second side of the transformer is configured to connect to the first end of the coil A2 on the second side of the transformer.

According to embodiments of the present disclosure, the isolated power module further includes a nineteenth resistor network R19. The nineteenth resistor network R19 is located on a line between the coil A2 on the second side of the transformer and the positive or negative electrode of the isolated power module Y1, and configured to perform status detection for a charging circuit of the isolated power module Y1.

In the example of FIG. 6, the nineteenth resistor network R19 is located on the line between the coil A2 on the second side of the transformer and the positive electrode of the isolated power module Y1, and a diode D1 is provided as a rectifier. The diode D1 is connected to the first end of the coil A2 on the second end of the transformer 602. In an example, the diode D1 may also be connected to the second end of the coil A2 on the second side of the transformer 602.

In the example of FIG. 7, the nineteenth resistor network R19 is located on the line between the coil A2 on the second side of the transformer and the positive electrode of the isolated power module Y1, and a diode D2 and a diode D3 are provided as a rectifier. The diode D2 is connected to the first end of the coil A2 on the second side of the transformer 602, and the diode D3 is connected to the second end of the coil A2 on the second side of the transformer 602.

In the example of FIG. 6 and FIG. 7, the isolated power module Y1 further includes a first isolation transmission unit 603. A first end of the first isolation transmission unit 603 is connected to a first end or a second end of the nineteenth resistor network R19, and a second end of the first isolation transmission unit 603 is connected to a first input terminal of the isolated power driving unit 601.

Specifically, the first isolation transmission unit 603 may be an isolation circuit capable of implementing analog transmission, and may include, for example, an isolation switch and a sampling circuit. The sampling circuit is configured to collect a voltage feedback signal from the first end or the second end of the nineteenth resistor network R19. The isolation switch may be an isolation optocoupler, etc. When the isolation switch is in ON state, the voltage feedback signal can be safely transmitted to the isolated power driving unit 601. The isolated power driving unit 601 may adjust the charging current of the isolated power module Y1 according to the voltage feedback signal, so as to maintain the charging current in a steady state.

In the examples of FIG. 6 and FIG. 7, the isolated power module Y1 further includes a current sampling unit 605, a second isolation transmission unit 604, and a microprocessor unit 606 that are electrically connected in sequence. The current sampling unit 605 is respectively connected to the first end and the second end of the nineteenth resistor network R19. The microprocessor unit 606 is further connected to a second input terminal of the isolated power driving unit 601.

The current sampling unit 605 may be a differential sampling circuit, and the second isolation transmission unit 604 may be an isolation circuit capable of implementing digital transmission. The differential sampling circuit is configured to collect a voltage feedback signal from the first end and the second end of the nineteenth resistor network R19, calculate a current of the charging circuit, and then safely transmit the current of the charging circuit through the digital isolation circuit to the microprocessor unit 606. Alternatively, the voltage collected from the first end and the second end of the nineteenth resistor network R19 may be directly transmitted to the microprocessor unit 606, and the current of the charging circuit may be calculated by the microprocessor unit 606. The microprocessor unit 606 can determine a value of the charging current at different time instances during the charging on the load side by the isolated power module Y1, so as to indirectly determine whether a short circuit occurs in the load circuit, thereby avoiding safety issues caused by the short circuit of the load circuit.

It should be noted that although FIG. 6 and FIG. 7 only illustrate a flyback boost isolated power module and a push-pull isolated power module, it can be understood that any power module capable of implementing isolation transmission, such as a flyback buck isolated power module, should be within the scope of protection of the present application. Those skilled in the art can make a selection according to actual needs.

FIG. 8 is a schematic flow chart of a detection method for an insulation detection circuit according to an eighth embodiment of the present disclosure. As shown in FIG. 8, the detection method includes steps 801 and 802.

In step 801, a first sampled signal is acquired from the first sampling point S11, a second sampled signal is acquired from the second sampling point S12, and according to the first sampled signal and the second sampled signal, an insulation resistance value Rip of a positive high-voltage circuit on a side of the battery pack under detection relative to the first reference voltage terminal GND1 and an insulation resistance value Rin of a negative high-voltage circuit on the side of the battery pack under detection relative to the first reference voltage terminal GND1 are obtained.

The first sampled signal and the second sampled signal may be acquired by controlling ON/OFF states of the first switch K1 and the second switch K2. For example, firstly by having the first switch K1 in ON state and the second switch K2 in OFF state, the first sampled signal is acquired from the first sampling point S11; and then by having the first switch K1 in OFF state and the second switch K2 in ON state, the second sampled signal is acquired from the second sampling point S12.

In step 802, a third sampled signal is acquired from the third sampling point, a fourth sampled signal is acquired from the fourth sampling point, and according to the third sampled signal and the fourth sampled signal, an insulation resistance value Rep of a positive high-voltage circuit on a load side relative to the second reference voltage terminal GND2 and an insulation resistance value Ren of a negative high-voltage circuit on the load side relative to the second reference voltage terminal GND2.

The third sampled signal and the fourth sampled signal may be acquired by controlling ON/OFF states of the fifth switch K5 and the sixth switch K6. For example, firstly by having the fifth switch K5 in ON state and the sixth switch K6 in OFF state, the third sampled signal is acquired from the third sampling point S21; and then by having the fifth switch K5 in OFF state and the sixth switch K6 in ON state, the fourth sampled signal is acquired from the fourth sampling point S22.

FIG. 1 to FIG. 5 also schematically show positions of the insulation resistance Rip and the insulation resistance Rin on the side of the battery pack under detection and the insulation resistance Rep and the insulation resistance Ren on the load side in the circuit diagram.

The detection process of the insulation resistance Rip and the insulation resistance Rin will be described in detail below based on Kirchhoff's law and the insulation detection circuit of FIG. 2.

Firstly, the first switch K1 and the second switch K2 are simultaneously closed (i.e. in ON state). At this time, a voltage across the second resistor network R2 is measured as Vb1, and a voltage across the third resistor network R3 is measured as Vb2. A total voltage Ubat of the battery pack under detection can be calculated by using the following formula.

$$Ubat = \frac{Vb1*(R1+R2)}{R2} + \frac{Vb2*(R3+R4)}{R4} \qquad (1)$$

Then, the first switch K1 is closed (i.e. in ON state) and the second switch K2 is open (i.e. in OFF state). At this time, the voltage across the second resistor network R2 is a positive internal resistance sampling voltage, which is denoted as Vp.

Next, the first switch K1 is open and the second switch K2 is closed. At this time, the voltage across the third resistor network R3 is a negative internal resistance sampling voltage, which is denoted as Vn.

According to Kirchhoff's law, Rip and Rin can be derived as follows:

$$Rip = \frac{Ubat*R3*(Ubat*R2 - Vp*(R1+R2)) -}{Ubat*Vn*R2 - Vp*Vn*(R1+R2) + Vp*Vn*(R3+R4)} \qquad (2)$$

$$Rin = \frac{Ubat*Vn*R2*R3 - Vp*Vn*R4*(R1+R2) -}{Ubat*Vp*R3 + Vp*Vn*R1 + Vp*Vn*R2} \qquad (3)$$

Here, R1 is the resistance value of the first resistor network R1, R2 is the resistance value of the second resistor network R2, R3 is the resistance value of the third resistor network R3, and R4 is the resistance value of the fourth resistor network R4. Since R1 to R4 are known quantities and Ubat, Vp, and Vn are detected quantities, the values of Rip and Rin can be calculated according to formulas (1) to (3).

It should be noted that, although the above steps include the detection of the total voltage Ubat of the battery pack under detection, a person skilled in the art can obtain the value of Ubat by parameter query or direct high-voltage sampling, which is not limited herein.

Likewise, the insulation resistance Rep and the insulation resistance Ren on the load side of the battery pack under detection can be detected in a similar way. Firstly, the fifth switch K5 is closed and the sixth switch K6 is open. At this time, the voltage across the sixth resistor network R6 is a positive external resistance sampling voltage, which is denoted as Vep. Then, the fifth switch K5 is open and the sixth switch K6 is closed. At this time, the voltage across the seventh resistor network R7 is a negative external resistance sampling voltage, which is denoted as Ven.

According to Kirchhoff's law, Rep and Ren can be derived as follows:

$$Rep = \frac{Uiso*R7*(Uiso*R6 - Vep*(R5+R6)) -}{Uiso*Ven*R6 - Vep*Ven*(R5+R6) + Vep*Ven*(R7+R8)} \qquad (4)$$

$$Ren = \frac{Uiso*Ven*R6*R7 - Vep*Ven*R7*(R5+R6) -}{Uiso*Vep*R7 + Vep*Ven*R5 + Vep*Ven*R6} \qquad (5)$$

Here, R5 is the resistance value of the fifth resistor network R5, R6 is the resistance value of the sixth resistor network R6, R7 is the resistance value of the seventh resistor network R7, R8 is the resistance value of the eighth resistor network R8, and Uiso is the total output voltage of the isolated power module Y1.

Since R1~R4 are known quantities, Vep and Ven are the detected quantities, and Uiso has been determined when designing the isolated power module, the values of Rep and Ren can be calculated according to formulas (4) and (5).

In order to simplify the above formulas, R1=R3, R2=R4, R5=R7 and R6=R8 can be made at the time of design, and the simplified formulas will not be described here.

For the insulation detection circuit in FIG. 3, the values of the insulation resistance Rip and the insulation resistance Rin on the side of the battery pack under detection, and the values of the insulation resistance Rep and the insulation resistance Ren on the load side can be obtained by referring to the above derivation flow.

Figure 9:
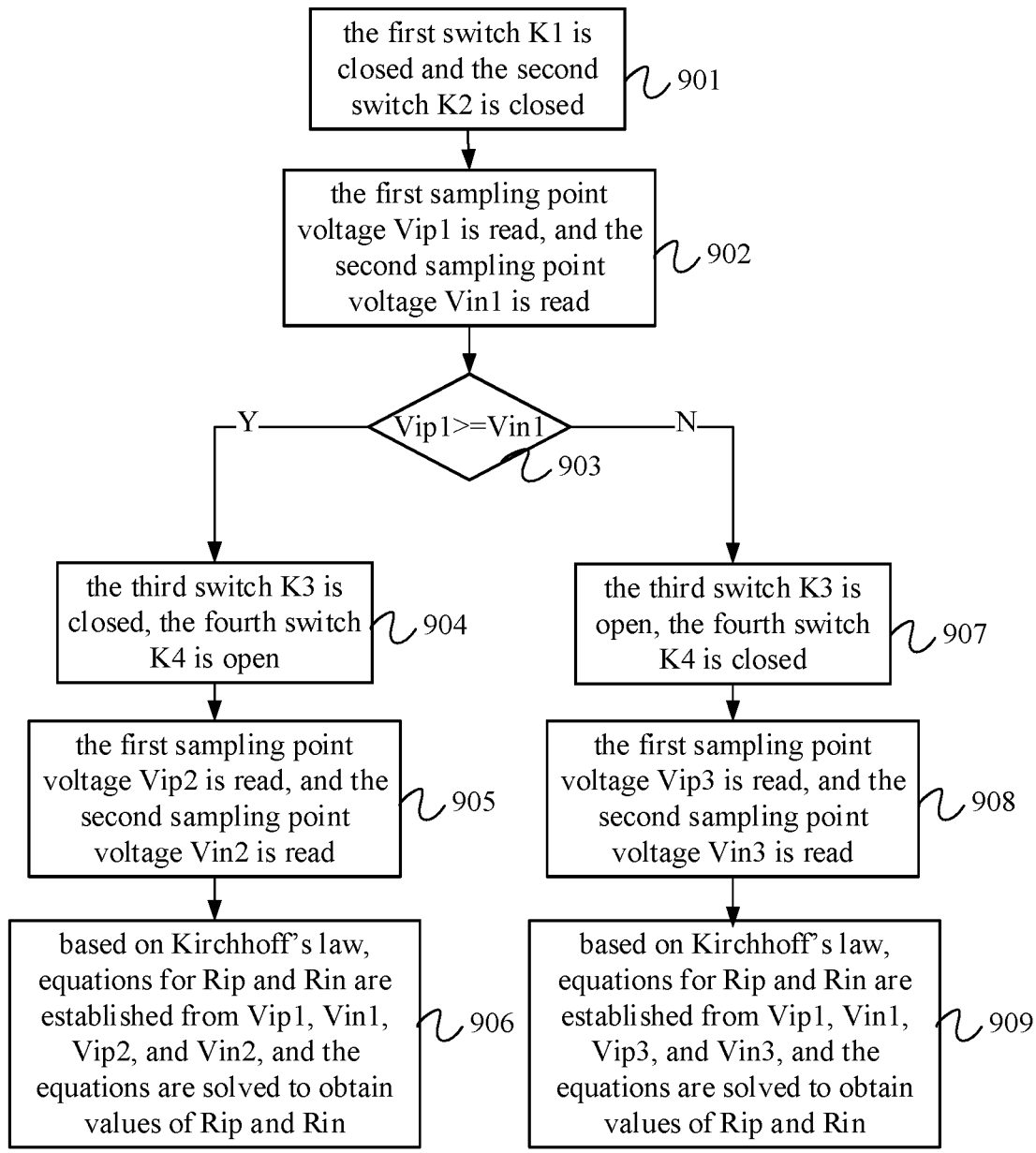
FIG. 9 is a schematic flow chart of a detection method for an insulation detection circuit according to a ninth embodiment of the present disclosure.

FIG. 9 is a schematic flow chart of a detection method for an insulation detection circuit according to a ninth embodiment of the present disclosure. The detection method includes steps 901 to 909. The detection process of the insulation resistance Rip and the insulation resistance Rin of the positive high-voltage circuit on the side of the battery pack under detection relative to the first reference voltage terminal GND1 based on the insulation detection circuits of FIG. 4 and FIG. 5 will be described in detail below by referring to the steps in FIG. 9.

In step 901, the first switch K1 is closed and the second switch K2 is closed.

In step 902, the first sampling point voltage Vip1 is read, and the second sampling point voltage Vin1 is read.

In step 903, it is determined whether Vip1≥Vin1 is TRUE. If yes, the process proceeds to step 904, otherwise the process proceeds to step 907.

In step 904, the third switch K3 is closed, the fourth switch K4 is open, and Vip1 and line impedance are reduced by voltage division to improve detection accuracy.

In step 905, the first sampling point voltage Vip2 is read, and the second sampling point voltage Vin2 is read.

In step 906, based on Kirchhoff's law, equations for Rip and Rin are established from Vip1, Vin1, Vip2, and Vin2, and the equations are solved to obtain values of Rip and Rin.

In step 907, the third switch K3 is open, the fourth switch K4 is closed, and Vin2 and line impedance are reduced by voltage division to improve detection accuracy.

In step 908, the first sampling point voltage Vip3 is read, and the second sampling point voltage Vin3 is read.

In step 909, based on Kirchhoff's law, equations for Rip and Rin are established from Vip1, Vin1, Vip3, and Vin3, and the equations are solved to obtain values of Rip and Rin.

According to embodiments of the present disclosure, by comparing the insulation resistance value Rip and the insulation resistance value Rin with respective preset standard thresholds, it is possible to monitor in real time whether the insulation impedance between the main positive and the battery case and the insulation impedance between the main negative and the battery case on the side of the battery pack under detection meet the standards, thereby avoiding safety issues caused by the insulation impedance between the main positive and the battery case and the insulation impedance between the main negative and the battery case on the side of the battery pack under detection not meeting the standards.

Likewise, by comparing the insulation resistance value Rep and the insulation resistance value Ren with respective preset standard thresholds, it is possible to monitor in real time whether the insulation impedance between the main positive and the vehicle body and the insulation impedance between the main negative and the vehicle body on the load side meet the standards, thereby avoiding safety issues caused by the insulation impedance between the main positive and the vehicle body and the insulation impedance between the main negative and the vehicle body on the load side not meeting the standards.

Figure 10:
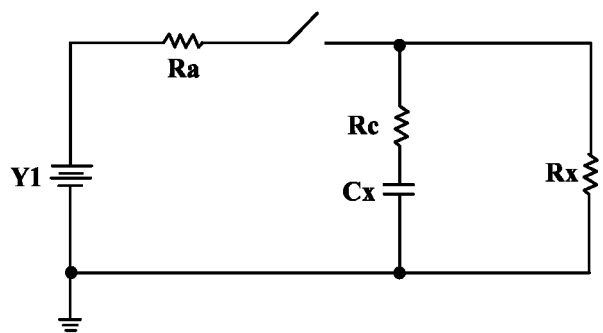
FIG. 10 shows a charging simulation circuit of an isolated power module according to a tenth embodiment of the present disclosure.

FIG. 10 shows a charging simulation circuit of an isolated power module according to a tenth embodiment of the present disclosure. In the figure, Y1 is the isolated power, Ra is an equivalent line impedance, Rx is an equivalent load impedance, Cx is an X capacitance, and Rc is an equivalent impedance of an X capacitor.

Figure 11:
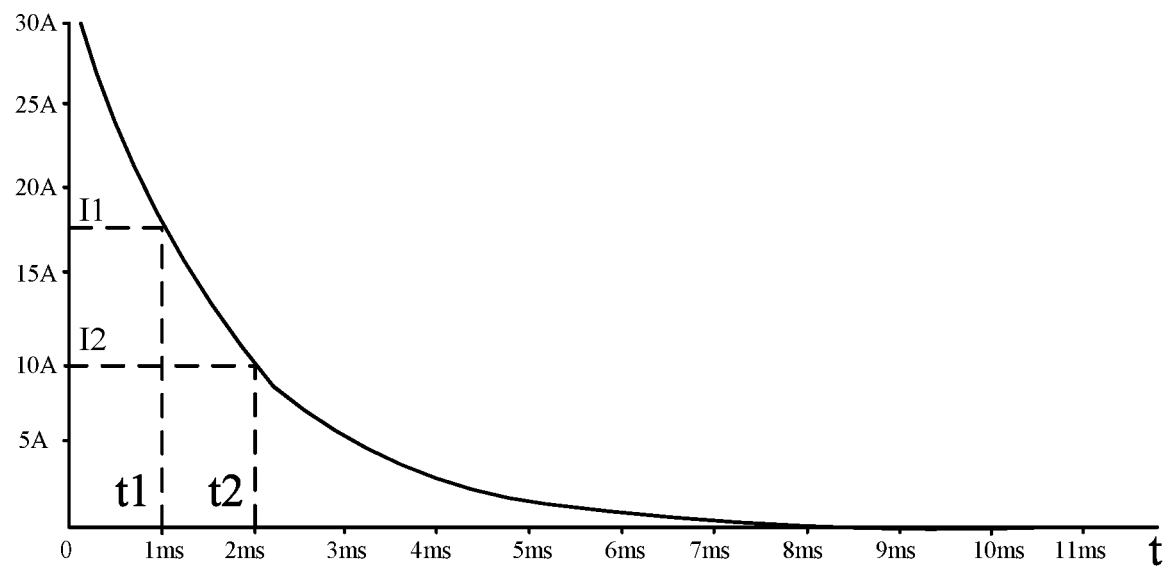
FIG. 11 shows a simulation curve of a charging current corresponding to FIG. 10.

FIG. 11 shows a simulation curve of a charging current corresponding to FIG. 10, in which the abscissa represents the time and the ordinate represents the current. In the example of FIG. 11, the output voltage of the isolated power Y1 is 60 V, the equivalent line impedance Ra is 1Ω, the equivalent load impedance Rx is 1 kΩ, and the equivalent impedance Rc is 1Ω.

It can be seen from FIG. 11 that due to the existence of the Cx capacitor, the charging current of the isolated power module Y1 is large when the isolated power module Y1 starts to work, and the charging current gradually decreases with the extension of the charging time and finally stabilizes. During the decreasing of the charging current, the decreasing rate in the early stage is greater than that in the later stage.

Based on this, in order to avoid safety issues caused by the short circuit of the load circuit, it is possible to determine a value of the charging current at different time instances during the charging on the load side by the isolated power module Y1, so as to indirectly determine whether a short circuit occurs in the load circuit. In an example, it is possible to selectively detect and compare the currents at two time instances, and determine whether there is a short circuit condition in the load circuit based on the comparison result.

Particularly, the detection method may include acquiring, at a first predetermined time instance, a first set of voltage signals from the first end and the second end of the nineteenth resistor network R19, and obtaining, according to the first set of voltage signals, a charging current of the isolated power module Y1 at the first predetermined time instance; acquiring, at a second predetermined time instance, a second set of voltage signals from the first end and the second end of the nineteenth resistor network R19, and obtaining, according to the second set of voltage signals, a charging current of the isolated power module Y1 at the second predetermined time instance, wherein the first predetermined time instance is earlier than the second predetermined time instance; comparing the charging current at the first predetermined time instance with the charging current at the second predetermined time instance; determining, according to a result of the comparing, whether a short circuit occurs in a load circuit of the battery pack under detection; and when the short circuit occurs in the load circuit, sending a disabling signal to the isolated power driving unit 601 and reporting, to a superior controller, information indicating that the load circuit fails, so as to disable the positive switch module K+ and the negative switch module K−.

Referring to FIG. 11, the current detected at time t1 can be set as I1. After a period of time, the current detected at time t2 is I2. If I1>I2, it means that the load impedance at the load side is basically normal and the next insulation detection can be performed. If I1≤I2, it means that the load circuit is short-circuited. In this case, it is necessary to immediately report the load impedance abnormal fault on the load side, and send a disabling signal to the isolated power driving unit 601 in time so as to avoid the risk of a high-voltage short circuit caused by an abnormal load even the insulation impedance relative to a low-voltage ground is normal. The specific values of t1 and t2 can be selected by a person skilled in the art according to actual situations, which is not limited herein.

Figure 12:
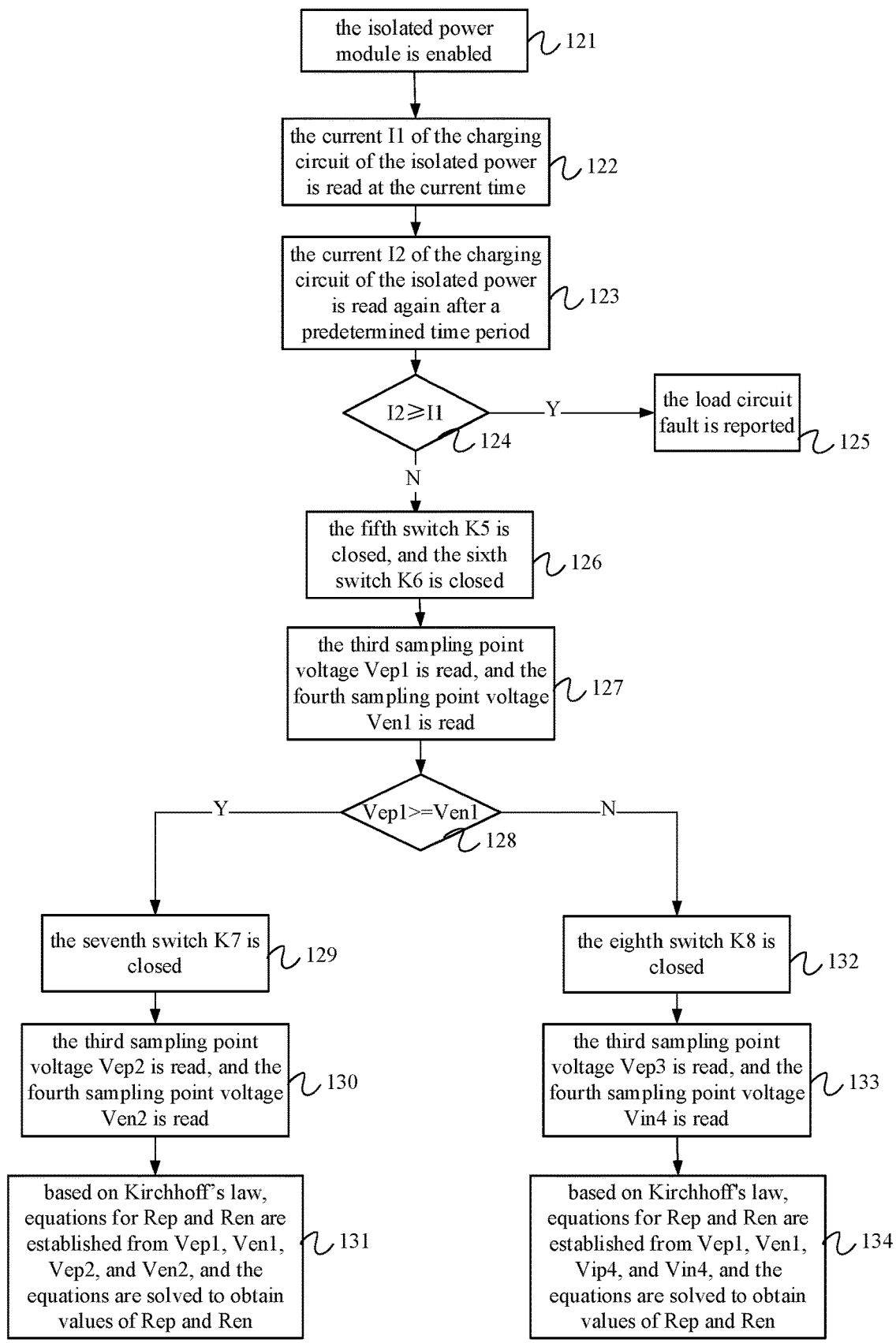
FIG. 12 is a schematic flow chart of a detection method for an insulation detection circuit according to an eleventh embodiment of the present disclosure.

FIG. 12 is a schematic flow chart of a detection method for an insulation detection circuit according to an eleventh embodiment of the present disclosure. The detection method includes steps 121 to 134. The detection process of the insulation resistance Rep and the insulation resistance Ren on the load side based on the insulation detection circuits of FIG. 4 and FIG. 5 will be described in detail below by referring to the steps in FIG. 12.

In step 121, the isolated power module is enabled.

In step 122, the current I1 of the charging circuit of the isolated power is read at the current time.

In step 123, the current I2 of the charging circuit of the isolated power is read again after a predetermined time period.

In step 124, it is determined whether I2≥I1 is TRUE. If yes, the process proceeds to step 125 is performed. Otherwise, the process proceeds to step 126.

In step 125, the load circuit fault is reported.

In step 126, the fifth switch K5 is closed, and the sixth switch K6 is closed.

In step 127, the third sampling point voltage Vep1 is read, and the fourth sampling point voltage Ven1 is read.

In step 128, it is determined whether Vep1≥Ven1 is TRUE. If yes, the process proceeds to step 129 is performed. Otherwise, the process proceeds to step 132.

In step 129, the seventh switch K7 is closed, and Vep1 and line impedance are reduced by voltage division to improve detection accuracy.

In step 130, the third sampling point voltage Vep2 is read, and the fourth sampling point voltage Ven2 is read.

In step 131, based on Kirchhoff's law, equations for Rep and Ren are established from Vep1, Ven1, Vep2, and Ven2, and the equations are solved to obtain values of Rep and Ren.

In step 132, the eighth switch K8 is closed, and Ven2 and line impedance are reduced by voltage division to improve detection accuracy.

In step 133, the third sampling point voltage Vep3 is read, and the fourth sampling point voltage Vin4 is read.

In step 134, based on Kirchhoff's law, equations for Rep and Ren are established from Vep1, Ven1, Vip4, and Vin4, and the equations are solved to obtain values of Rep and Ren.

Figure 13:
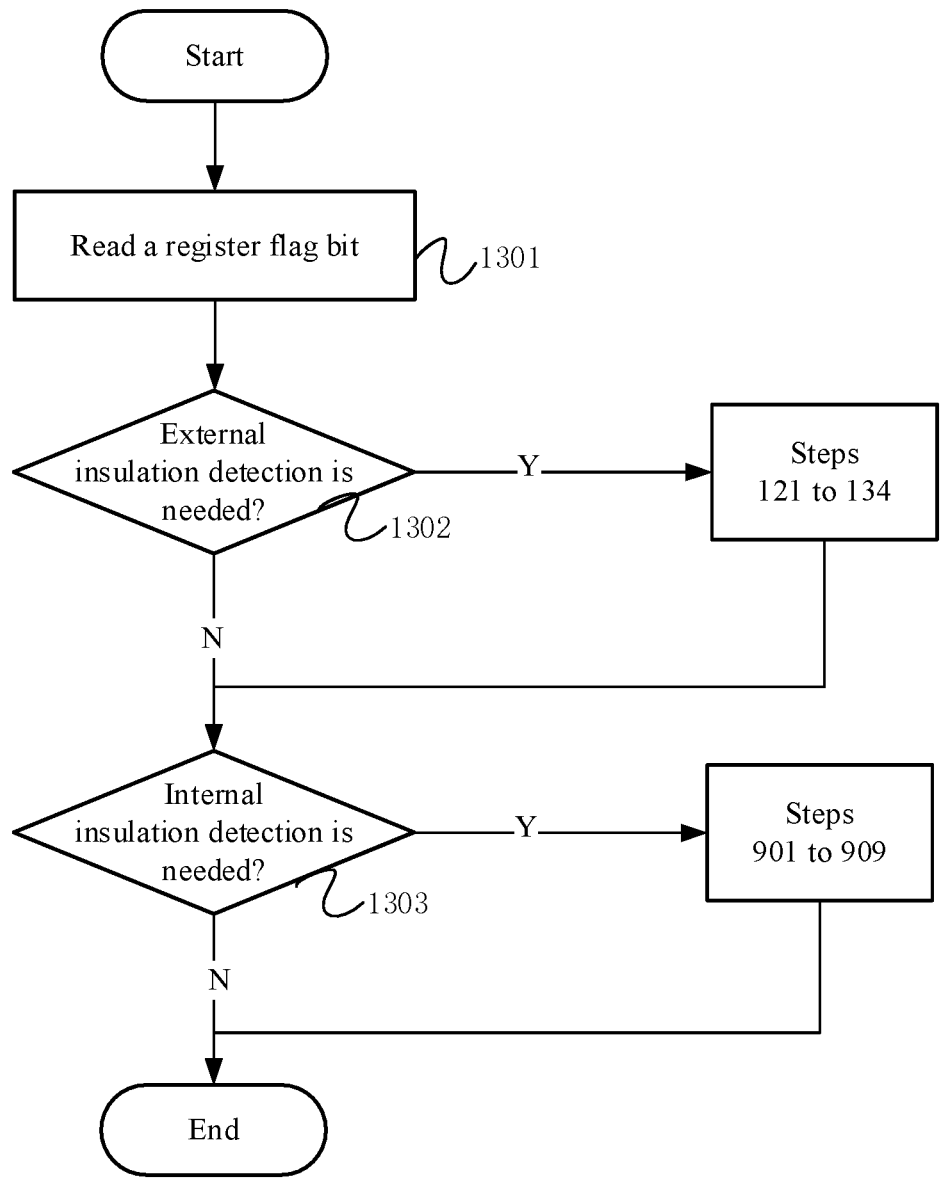
FIG. 13 is a schematic flow chart of a detection method for an insulation detection circuit according to a twelfth embodiment of the present disclosure.

FIG. 13 is a schematic flow chart of a detection method for an insulation detection circuit according to a twelfth embodiment of the present disclosure. The detection method includes steps 1301 to 1303. The insulation detection strategy in the embodiments of the present disclosure will be briefly described by referring to the steps in FIG. 13.

In step 1301, a register flag bit is read. The register flag bit can be read to know whether the insulation resistance value is abnormal when the power battery under detection is operated last time. If the insulation resistance value is abnormal, the subsequent insulation detection is performed. Otherwise, the insulation detection may be ignored.

In step 1302, it is determined whether an external insulation detection is needed. If the external insulation detection is needed, the process proceeds to step 121 in FIG. 12 to start the detection process for the insulation resistance value Rep and the insulation resistance value Ren on the load side of the battery pack under detection, and then the process proceeds to step 1303 after the processing of steps 121 to 134 is completed. If the external insulation detection is not needed, the process may directly proceed to step 1303.

In step 1303, it is determined whether an internal insulation detection is needed. If the internal insulation detection is needed, the process proceeds to step 901 in FIG. 9 to start the detection process for the insulation resistance value Rip and the insulation resistance value Rin on the side of the battery pack under detection, and the insulation detection process ends after the processing of steps 901 to 909 is completed. If the internal insulation detection is not needed, the internal insulation detection may be ignored and the process ends.

Embodiments of the present disclosure also provide a battery management system including the insulation detection circuit as described above.

It is to be understood that various embodiments in the description are described in a progressive manner. The same or similar parts among various embodiments may be referred to each other. Different emphasis is placed on different embodiments. For device embodiments, reference may be made to the description of method embodiments for related parts. The embodiments of the present disclosure are not limited to specific steps and structures described above and shown in the drawings. A person skilled in the art may make various changes, modifications, and additions, or change the order of the steps after understanding the spirit of the present disclosure. Also, for the purpose of concision, detailed description of known technique is omitted herein.

Function blocks illustrated in the above structural diagram may be implemented as hardware, software, firmware, or combination thereof. When implemented in hardware, it may be, for example, an electronic circuit, Application Specific Integrated Circuit (ASIC), appropriate firmware, plug-in, function card, and the like. When implemented in software, elements of the present disclosure may be programs or code segments used to perform tasks as required. The programs or code segments may be stored in machine readable medium, or communicated over transmission medium or communication links through data signals carried in carriers. The "machine readable medium" may include any medium that can store or communication information. Examples of machine readable medium may include: an electronic circuit, a semiconductor memory device, a ROM, a flash drive, an Erasable ROM (EROM), a floppy, a CD-ROM, an optical disk, a hard disk, optic fiber medium, a radio frequency (RF) link, etc. Code segments may be downloaded via computer networks such as the Internet, an intranet, etc.

It is to be understood, however, that the embodiments of the disclosure are not limited to the specific configurations and processes described above and shown in the drawings. Also, for the purpose of concision, detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications, and additions, or change the order of the steps after understanding the spirit of the present disclosure.

The embodiments of the present disclosure may be implemented in other specific forms without departing from the spirit and essential characteristics thereof. For example, the algorithms described in the specific embodiments may be modified as long as the system architecture will not depart from the basic spirit of the embodiments of the present disclosure. The present embodiments are therefore to be considered in all respects as illustrative but not restrictive. The scopes of the embodiments are to be defined by the appended claims rather than the foregoing description. All the changes within the scope of the subject matters of the claims and their equivalents are thus to be included in the scope of the embodiments of the present disclosure.

What is claimed is:

1. An insulation detection circuit, comprising: an isolated power module, a first positive sampling module, a first negative sampling module, a second positive sampling module, a second negative sampling module, and a processor, wherein:

a first end of the first positive sampling module is respectively connected to a positive electrode of a battery pack under detection and a first end of a positive switch module, a second end of the first positive sampling module is connected to a first reference voltage terminal, the first positive sampling module is configured to provide a first sampled signal to a first sampling point, and the battery pack under detection is to supply electric energy to an electric motor of an electric vehicle;

a first end of the first negative sampling module is connected to the first reference voltage terminal, a second end of the first negative sampling module is respectively connected to a negative electrode of the battery pack under detection and a first end of a negative switch module, and the first negative sampling module is configured to provide a second sampled signal to a second sampling point;

the isolated power module is configured to supply power to the second positive sampling module and the second negative sampling module when the positive switch module and the negative switch module are not closed;

a first end of the second positive sampling module is respectively connected to a positive electrode of the isolated power module, a second end of the positive switch module and a positive high-voltage circuit on a load side, a second end of the second positive sampling module is connected to a second reference voltage terminal, and the second positive sampling module is configured to provide a third sampled signal to a third sampling point;

a first end of the second negative sampling module is connected to the second reference voltage terminal, a second end of the second negative sampling module is respectively connected to a negative electrode of the isolated power module, a second end of the negative switch module and a negative high-voltage circuit on the load side, and the second negative sampling module is configured to provide a fourth sampled signal to a fourth sampling point;

the processor is respectively connected to the first sampling point, the second sampling point, the third sampling point, and the fourth sampling point, and the processor is configured to calculate, according to the first sampled signal and the second sampled signal, an insulation resistance value of a positive high-voltage circuit on a side of the battery pack under detection relative to the first reference voltage terminal and an insulation resistance value of a negative high-voltage circuit on the side of the battery pack under detection relative to the first reference voltage terminal, and calculate, according to the third sampled signal and the fourth sampled signal, an insulation resistance value of the positive high-voltage circuit on the load side relative to the second reference voltage terminal and an insulation resistance value of the negative high-voltage circuit on the load side relative to the second reference voltage terminal;

the isolated power module comprises an isolated power driving unit and a transformer connected to each other;

the isolated power driving unit is powered by a DC voltage source or a battery pack; and an output voltage of the DC voltage source or the battery pack is supplied to the positive and negative electrodes of the isolated power module after being processed by the isolated power driving unit and the transformer.

2. The insulation detection circuit of claim 1, wherein:

the first positive sampling module comprises a first resistor network, a second resistor network, and a first switch connected in series;

a first end of the first resistor network is respectively connected to the positive electrode of the battery pack under detection and the first end of the positive switch module, and a second end of the first resistor network is respectively connected to a first end of the second resistor network and the first sampling point, and a second end of the second resistor network is connected to the first reference voltage terminal;

the first negative sampling module comprises a third resistor network, a fourth resistor network, and a second switch; and a first end of the third resistor network is connected to the first reference voltage terminal, a second end of the third resistor network is respectively connected to the second sampling point and a first end of the fourth resistor network, and a second end of the fourth resistor network is respectively connected to the negative electrode of the battery pack under detection and the first end of the negative switch module.

3. The insulation detection circuit of claim 2, further comprising a first pull-up voltage source and a ninth resistor network, wherein: a first end of the ninth resistor network is connected to the first pull-up voltage source, and a second end of the ninth resistor network is connected to the second sampling point.

4. The insulation detection circuit of claim 2, further comprising a tenth resistor network and a third switch connected in series, an eleventh resistor network and a fourth switch connected in series, a twelfth resistor network and a thirteenth resistor network, wherein:

a first end of the tenth resistor network is connected to the positive electrode of the battery pack under detection, and a second end of the tenth resistor network is connected to the first reference voltage terminal;

a first end of the eleventh resistor network is connected to the first reference voltage terminal, and a second end of the eleventh resistor network is connected to the negative electrode of the battery pack under detection;

the twelfth resistor network is connected in series with the tenth resistor network and the third switch, a first end of the twelfth resistor network is connected to the second end of the tenth resistor network, and a second end of the twelfth resistor network is connected to the first reference voltage terminal; and the thirteenth resistor network is connected in series with the eleventh resistor network and the fourth switch, a first end of the thirteenth resistor network is connected to the second end of the eleventh resistor network, and a second end of the thirteenth resistor network is connected to the negative electrode of the battery pack under detection.

5. The insulation detection circuit of claim 1, further comprising a first filter unit and a second filter unit, wherein:

a first end of the first filter unit is connected to the first sampling point, a second end of the first filter unit is connected to the processor, and the first filter unit is configured to perform filter processing on the first sampled signal; and a first end of the second filter unit is connected to the second sampling point, a second end of the second filter unit is connected to the processor, and the second filter unit is configured to perform filter processing on the second sampled signal.

6. The insulation detection circuit of claim 1, wherein:
the second positive sampling module comprises a fifth resistor network, a sixth resistor network, and a fifth switch connected in series;
a first end of the fifth resistor network is connected to the positive electrode of the isolated power module and the second end of the positive switch module, a second end of the fifth resistor network is respectively connected to the third sampling point and a first end of the sixth resistor network, and a second end of the sixth resistor network is connected to the second reference voltage terminal;
the second negative sampling module comprises a seventh resistor network, an eighth resistor network, and a sixth switch connected in series; and
a first end of the seventh resistor network is connected to the second reference voltage terminal, a second end of the seventh resistor network is respectively connected to the fourth sampling point and a first end of the eighth resistor network, and a second end of the eighth resistor network is respectively connected to the negative electrode of the isolated power module and the second end of the negative switch module.

7. The insulation detection circuit of claim 6, further comprising a fifteenth resistor network and a seventh switch connected in series, a sixteenth resistor network and an eighth switch connected in series, a seventeenth resistor network and an eighteenth resistor network, wherein:
a first end of the fifteenth resistor network is connected to the positive electrode of the isolated power module, and a second end of the fifteenth resistor network is connected to the second reference voltage terminal;
a first end of the sixteenth resistor network is connected to the second reference voltage terminal, and a second end of the sixteenth resistor network is connected to the negative electrode of the isolated power module;
the seventeenth resistor network is connected in series with the fifteenth resistor network and the seventh switch, a first end of the seventeenth resistor network is connected to the second end of the fifteenth resistor network, and a second end of the seventeenth resistor network is connected to the second reference voltage terminal; and
the eighteenth resistor network is connected in series with the sixteenth resistor network and the eighth switch, a first end of the eighteenth resistor network is connected to the second end of the sixteenth resistor network, and a second end of the eighteenth resistor network is connected to the negative electrode of the isolated power module.

8. The insulation detection circuit of claim 1, further comprising a third filter unit and a fourth filter unit, wherein:
a first end of the third filter unit is connected to the third sampling point, a second end of the third filter unit is connected to the processor, and the third filter unit is configured to perform filter processing on the third sampled signal; and
a first end of the fourth filter unit is connected to the fourth sampling point, a second end of the fourth filter unit is connected to the processor, and the fourth filter unit is configured to perform filter processing on the fourth sampled signal.

9. The insulation detection circuit of claim 1, further comprising a first analog-to-digital conversion unit, a second analog-to-digital conversion unit, a third analog-to-digital conversion unit, and a fourth analog-to-digital conversion unit, wherein:
two ends of the first analog-to-digital conversion unit are respectively connected to the first sampling point and the processor;
two ends of the second analog-to-digital conversion unit are respectively connected to the second sampling point and the processor;
two ends of the third analog-to-digital conversion unit are respectively connected to the third sampling point and the processor; and
two ends of the fourth analog-to-digital conversion unit are respectively connected to the fourth sampling point and the processor.

10. The insulation detection circuit of claim 1, wherein a coil of the transformer comprises two terminals, which are respectively a first terminal and a second terminal, wherein:
a first terminal of a coil on a first side of the transformer is connected to a first output terminal of the isolated power driving unit, and a second terminal of the coil on the first side of the transformer is connected to a second output terminal of the isolated power driving unit; and
a first terminal of a coil on a second side of the transformer supplies power to the positive electrode of the isolated power module, and a second terminal of the coil on the second side of the transformer supplies power to the negative electrode of the isolated power module.

11. The insulation detection circuit of claim 1, wherein a coil of the transformer comprises three terminals, which are respectively a first terminal, a second terminal, and a third terminal, wherein:
a first terminal of a coil on a first side of the transformer is connected to a first output terminal of the isolated power driving unit, a second terminal of the coil on the first side of the transformer is connected to a third reference voltage terminal, and a third terminal of the coil on the first side of the transformer is connected to a second output terminal of the isolated power driving unit; and
a first terminal of a coil on a second side of the transformer supplies power to the positive electrode of the isolated power module, a second terminal of the coil on the second side of the transformer supplies power to the negative electrode of the isolated power module, and a third terminal of the coil on the second side of the transformer is connected to the first terminal of the coil on the second side of the transformer.

12. The insulation detection circuit of claim 10, wherein the isolated power module further comprises a nineteenth resistor network, and the nineteenth resistor network is located on a line between the coil on the second side of the transformer and the positive or negative electrode of the isolated power module.

13. The insulation detection circuit of claim 12, wherein the isolated power module further comprises a first isolation transmission unit, and a current sampling unit, a second isolation transmission unit, and a microprocessor unit electrically connected in sequence;
a first end of the first isolation transmission unit is connected to a first end or a second end of the nineteenth resistor network, and a second end of the first isolation transmission unit is connected to a first input terminal of the isolated power driving unit;
the current sampling unit comprises a first sampling terminal and a second sampling terminal, the first sampling terminal is connected to a first end of the nineteenth resistor network, the second sampling terminal is connected to a second end of the nineteenth resistor network, and the microprocessor unit is further connected to a second input terminal of the isolated power driving unit.

14. A detection method for the insulation detection circuit of claim 1, wherein the detection method comprises:
   acquiring a first sampled signal from the first sampling point, acquiring a second sampled signal from the second sampling point, and calculating, according to the first sampled signal and the second sampled signal, an insulation resistance value of a positive high-voltage circuit on a side of the battery pack under detection relative to the first reference voltage terminal and an insulation resistance value of a negative high-voltage circuit on the side of the battery pack under detection relative to the first reference voltage terminal; and
   acquiring a third sampled signal from the third sampling point, acquiring a fourth sampled signal from the fourth sampling point, and calculating, according to the third sampled signal and the fourth sampled signal, an insulation resistance value of a positive high-voltage circuit on a load side relative to the second reference voltage terminal and an insulation resistance value of a negative high-voltage circuit on the load side relative to the second reference voltage terminal,
   wherein a voltage across a coil at a second side of the transformer is supplied to the positive and negative electrodes of the isolated power module after being rectified by a rectifying component; the isolated power module further comprises a nineteenth resistor network, and two ends of the nineteenth resistor network are respectively connected to an output terminal of the rectifying component and the positive or negative electrode of the isolated power module,
   wherein the method further comprises:
   acquiring, at a first predetermined time instance, a first set of voltage signals from the first end and the second end of the nineteenth resistor network, and calculating, according to the first set of voltage signals, a charging current of the isolated power module at the first predetermined time instance;
   acquiring, at a second predetermined time instance, a second set of voltage signals from the first end and the second end of the nineteenth resistor network, and calculating, according to the second set of voltage signals, a charging current of the isolated power module at the second predetermined time instance, wherein the first predetermined time instance is earlier than the second predetermined time instance;
   comparing the charging current at the first predetermined time instance with the charging current at the second predetermined time instance;
   determining, according to a result of the comparing, whether a short circuit occurs in a load circuit of the battery pack under detection; and
   when the load circuit fails, turning off the isolated power driving unit, disabling the positive switch module and the negative switch module, and reporting, to a superior controller, information indicating that the load circuit fails.

* * * * *